United States Patent
Tsubouchi et al.

(10) Patent No.: US 6,229,409 B1
(45) Date of Patent: May 8, 2001

(54) SURFACE ACOUSTIC WAVE MATCHED FILTER

(75) Inventors: Kazuo Tsubouchi, 30-38, Hitokita 2-chome, Taihaku-ku, Sendai-shi, Miyagi 982-0222 (JP); Michio Yokoyama, Sendai (JP); Shuichi Tomabechi, Sendai (JP); Takumi Suetsugu, Yokose-machi (JP); Yuichiro Imanishi, Nagoya (JP); Tomohiko Shibata, Kasuga (JP)

(73) Assignee: Kazuo Tsubouchi (JP)

( * ) Notice: Subject to any disclaimer, the term of this patent is extended or adjusted under 35 U.S.C. 154(b) by 0 days.

(21) Appl. No.: 09/203,000

(22) PCT Filed: Apr. 24, 1998

(86) PCT No.: PCT/JP98/01897

§ 371 Date: Mar. 18, 1999

§ 102(e) Date: Mar. 18, 1999

(87) PCT Pub. No.: WO98/49774

PCT Pub. Date: Nov. 5, 1998

(30) Foreign Application Priority Data

Apr. 25, 1997 (JP) .................................................. 9-109226

(51) Int. Cl.[7] ........................... H03H 9/64; H03H 17/00; H04B 1/69; H04J 13/02
(52) U.S. Cl. ..................... 333/193; 333/153; 333/154; 333/155; 333/196; 375/153; 375/343
(58) Field of Search ..................... 333/150–155, 333/193–196; 375/207, 343, 153; 708/815; 310/313 R, 313 B (56) References Cited

U.S. PATENT DOCUMENTS

| 3,980,962 | * | 9/1976 | Scotter | 333/150 X |
| 4,097,825 | * | 6/1978 | Gerard | 333/151 |
| 4,427,954 | * | 1/1984 | Veith et al. | 333/154 X |
| 4,625,207 | * | 11/1986 | Skeie | 333/152 X |
| 6,078,608 | * | 6/2000 | Ohtsuka et al. | 375/200 |

FOREIGN PATENT DOCUMENTS

| 49-53746 | 9/1972 | (JP) . | |
| 50-155155 | 12/1975 | (JP) . | |
| 52-42089 | 4/1977 | (JP) . | |
| 58-33311 | 2/1983 | (JP) . | |
| 59-163578 | 9/1984 | (JP) . | |
| 62-1309 | * 1/1987 | (JP) | 333/150 |
| 1-123516 | 5/1989 | (JP) . | |
| 2-132938 | 5/1990 | (JP) . | |
| 4-17409 | * 1/1992 | (JP) | 333/154 |
| 7-193478 | 7/1995 | (JP) . | |
| 7-221670 | 8/1995 | (JP) . | |
| 7-264093 | 10/1995 | (JP) . | |
| 8-88535 | 4/1996 | (JP) . | |
| 11-27091 | * 1/1999 | (JP) . | |

* cited by examiner

Primary Examiner—Benny Lee
Assistant Examiner—Barbara Summons
(74) Attorney, Agent, or Firm—Parkhurst & Wendel, LLP

(57) ABSTRACT

An output side electrode of a surface acoustic wave matched filter with portions having different delay times between taps. The output side electrode may be provided by arranging parallelly a plurality of output side electrodes having different scales, different tap distances, or by forming output side electrodes in an inclined fashion or in a dog-leg shape viewed in a direction of an aperture length, or by arranging, between electrode fingers, thin films having different dimensions or thicknesses viewed in the direction of the aperture length, or by forming, between electrode fingers, recessed portions having different dimension or depth viewed in the direction of the aperture length. In the surface acoustic wave matched filter for use in a spread spectrum communication, it is possible to prevent a decrease in a correlation caused by a variation in a propagating velocity of a surface acoustic wave due to a temperature characteristic as well as by fluctuations in the propagating velocity for respective substrates or within a single substrate.

16 Claims, 6 Drawing Sheets

FIG_3

FIG_4

FIG. 5

FIG_7

FIG_8

FIG_9

FIG_10

SURFACE ACOUSTIC WAVE MATCHED FILTER

TECHNICAL FIELD

The present invention relates to a surface acoustic wave matched filter comprising a substrate made of a piezo-electrical material, an input side electrode means formed on the substrate for receiving a spread spectrum signal, and an output side electrode means formed on the substrate to constitute a delay line with taps for receiving a surface acoustic wave propagated from the input side electrode means to generate a demodulated signal.

Figure 1:
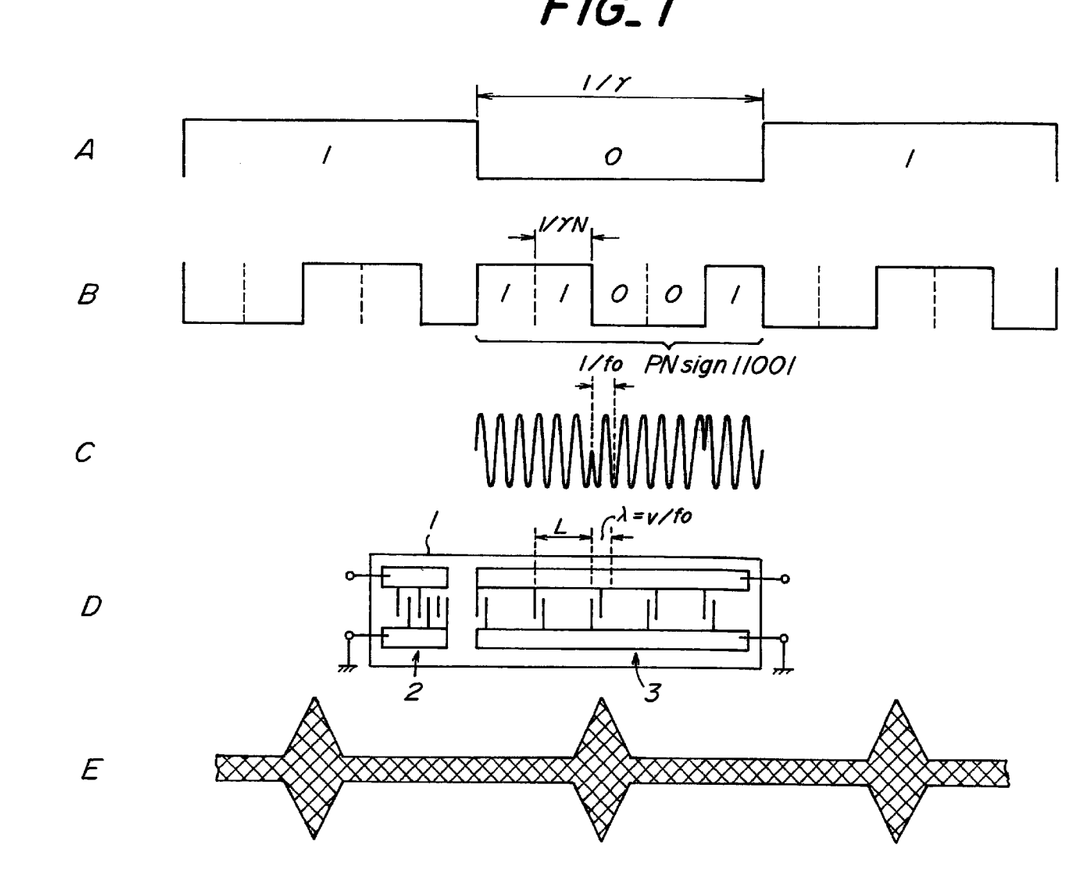
FIGS. 1A–1E are schematic views explaining the operation of the surface acoustic wave matched filter.

The spread spectrum signal thus transmitted is supplied to an input side electrode 2 of a surface acoustic wave matched filter 1 as shown in FIG. 1D. The surface acoustic wave matched filter 1 further comprises an output side electrode 3 and a demodulate signal is derived therefrom. The output side electrode 3 constitute a delay line with taps, and includes an array of electrode fingers. Now it is assumed that a propagating velocity of the surface acoustic wave along the surface of the substrate of the surface acoustic wave matched filter is v, said array of electrode fingers has a period $\lambda$ equal to $v/f_0$, a tap distance L equal to v/rN, and a tap pattern determined in accordance with the polarity of the PN code. In an ideal condition, the output side electrode 3 produces a demodulated signal having a strong correlation with an original base-band signal as shown in FIG. 1E.

However, in actual surface acoustic wave matched filters, the propagating velocity of the surface acoustic wave is changed in accordance with temperature variation of the substrate, and the propagating velocity of the surface acoustic wave fluctuates for respective substrates. Furthermore, the propagating velocity of the surface acoustic wave fluctuates locally within a single substrate. When the propagating velocity of the surface acoustic wave varies in this manner, the correlation between the demodulated signal derived from the output side electrode and the base-band signal could not be attained and the spread spectrum signal could not be demodulated accurately.

To eliminate the above disadvantage, in JP Kokai-Hei 8-88535, there is proposed a surface acoustic wave matched filter, in which a variation in temperature of a substrate is suppressed by means of a temperature regulator. In JP Kokai-Hei 2-132938, there is described another surface acoustic wave matched filter, in which an output side electrode is divided into two parts viewed in the propagating direction of the surface acoustic wave, and these parts are arranged in parallel with each other also viewed in the propagating direction of the surface acoustic wave. An output signal from the rear half of the output side electrode is synthesized with an output signal from the front half of the output side electrode through a delay element. In JP Kokai-Hei 7-193478, there is proposed another surface acoustic wave matched filter, in which an output side electrode is divided into plural blocks, which are arranged in parallel each other viewed in the propagating direction of the surface acoustic wave, output signals from these blocks are converted into digital signals through respective comparators, and a demodulated signal is derived by supplying these digital signals to a calculator unit.

In the surface acoustic wave matched filter disclosed in the above JP Kokai-Hei 8-88535, a heater is provided for controlling the temperature of a piezo-electrical substrate such that the propagating velocity of the surface acoustic wave does not change due to the temperature characteristic of the substrate. Thus, the surface acoustic wave matched filter has an increased power consumption and has the complicated and expensive structure. Moreover, the local fluctuation in the propagating velocity of the surface acoustic wave within a single substrate could not be compensated for.

In the surface acoustic wave matched filter described in the above mentioned JP Kokai-Hei 2-132938, since the output side electrode is divided into two parts, the fluctuation in the propagating velocity of the surface acoustic wave due to the temperature characteristic could not be sufficiently corrected. Since the delay element is provided in the filter, additional fluctuation is disadvantageously introduced due to a fluctuation in a delay time of the delay element depending on the temperature change thereof. Like as the above explained conventional filter, the local change in the propagating velocity of the surface acoustic wave within a single substrate could not be compensated for.

In the surface acoustic wave matched filter disclosed in the above JP Kokai-Hei 7-193478, the degree of correcting the influence of the fluctuation in the propagating velocity of the surface acoustic wave due to the temperature characteristic changes depending on the number of the divided output side electrode parts. In the example shown in FIG. 1, the fluctuation is most highly corrected by dividing the output side electrode into N. However, in this case, a size of the filter becomes large and an output processing circuit requires comparators and calculators, and thus the filter is liable to be complicated in construction and the power consumption is increased.

It is an object of this invention to provide a surface acoustic wave matched filter, in which the above defects can be eliminated and a decrease in the correlation of the demodulated signal caused by the variation in the propagating velocity of the surface acoustic wave due to the temperature variation as well as by the fluctuation in the propagating velocity of the surface acoustic wave for respective substrates and the local fluctuation within a single substrate, and delay elements or complex circuit is not required, and thus the power consumption is low.

DISCLOSURE OF THE INVENTION

According to the invention, the surface acoustic wave matched filter comprising a substrate made of a piezo-electrical material, an input side electrode means formed on the substrate for receiving a spread spectrum signal, an output side electrode means formed on the substrate to constitute a delay line with taps for receiving a surface acoustic wave propagated from the input side electrode means to produce a demodulated signal, wherein said output side electrode means includes parts having different delay times between taps.

The surface acoustic wave matched filter of the present invention may be practiced in various configurations, which may be roughly classified into two groups. In one group, a plurality of parallel output side electrodes having different delay times between taps are arranged in parallel with each other viewed in the propagating direction of the surface acoustic wave, and in the other group, a single output side electrode includes parts having different delay times between taps. In the former group, plural input side electrodes designed for the same standard propagating velocity are arranged in parallel with each other viewed in the propagating direction of the surface acoustic wave and a plurality of output side electrodes having different scales viewed at least in the propagating direction of the surface acoustic wave or plural output side electrodes having different tap distances are provided correspondingly to the plural input side electrodes, respectively. In the latter group, said plural parts having different delay times between taps may be constructed by shaping electrode fingers of the output side electrode to be inclined with respect to a distance of an aperture length or into a dog-leg configuration, or covering the surface of the substrate between the electrode fingers of the output side electrode with thin films with different film covering ratio, or forming recessed portions in the substrate surface between the electrode fingers of the output side electrode such that a length of the recessed portions viewed in the propagating direction of the surface acoustic wave is varied in the direction of the aperture length or a size of the depressions viewed in the propagating direction of the surface acoustic wave and a depth of the recessed portions are changed.

DESCRIPTION OF THE PREFERRED EMBODIMENT

Figure 2:
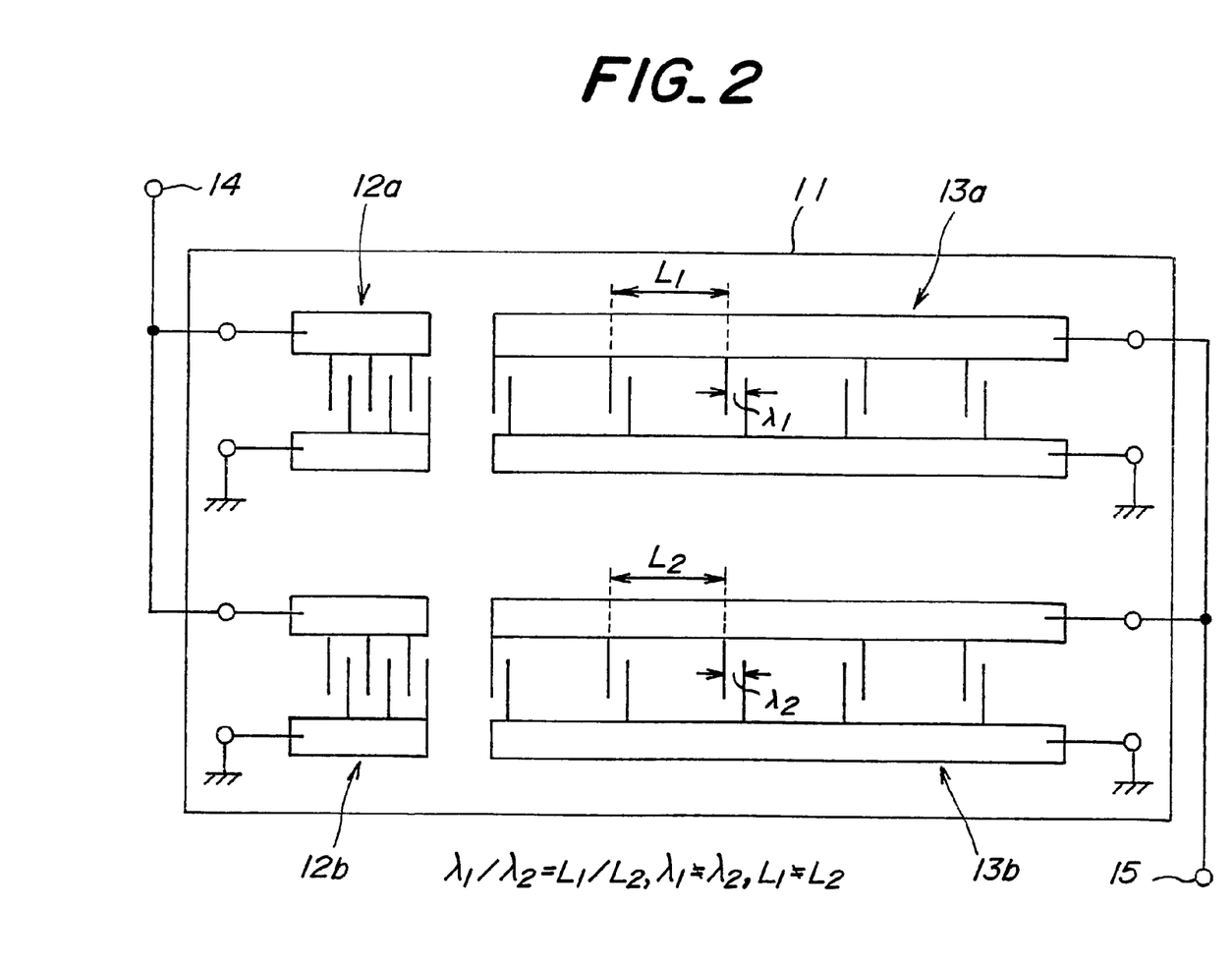
FIG. 2 is a schematic view showing the structure of a first embodiment of the surface acoustic wave matched filter according to this invention.

FIG. 2 is a schematic view showing the structure of a first embodiment of the surface acoustic wave matched filter according to the invention. In this embodiment, two input side electrodes 12a and 12b and two output side electrodes 13a and 13b are formed on a surface of a piezo-electrical substrate 11. The first and second input side electrodes 12a and 12b have the same structure and are connected to an input terminal 14 in parallel with each other. The input side electrodes convert a spread spectrum signals supplied to the input terminal 14 into a surface acoustic wave.

The first output side electrode 13a has a configuration which is similar to that of the second output side electrode 13b. Thus, although a period $\lambda_1$ of electrode fingers of the first electrode 13a is different from a period $\lambda_2$ of electrode fingers of the second electrode 13b and a tap distance $L_1$ of the first electrode 13a is different from that $L_2$ of the second electrode 13b, a ratio $\lambda_1/\lambda_2$ of the period of electrode fingers of the first 13a to that of the second output side electrodes 13b is identical with a ratio $L_1/L_2$ of the tap distance of the first electrode 13a to that of the second electrode 13b ($\lambda_1/\lambda_2 = L_1/L_2$). In other words, a scale of the first output side electrode 13a is different from that of the second output side electrode 13b.

In FIG. 2, it is now assumed that a carrier frequency $f_0$ of the spread spectrum signal is 2.500 GHz, a data rate is 2.09(=23/11) MHz, a length N of the PN code is 11 and the PN code is of the Baker code, for a propagating velocity of the surface acoustic wave v=6000 m/sec, the period $\lambda_1$ of the electrode fingers of the first output side electrode 13a is 2.4000 μm and the distance $L_1$ between taps is 259.2000(= 108×2.4) μm, and for a propagating velocity v=6003 m/sec, the period $\lambda_2$ of the electrode fingers of the second output side electrode 13b is 2.4012 μm and the distance $L_2$ between taps is 259.3296 μm. It should be noted that these values are shown only as a numerical example, and the present invention is not limited only to these values. As shown in FIG. 2, output signals from the first and second output side electrode 13a and 13b are summed up, and a sum signal is supplied to an output terminal 15.

By constructing the surface acoustic wave matched filter in the manner explained above, even if the propagating velocity of the surface acoustic wave varies due to the fact that the temperature of the piezo-electrical substrate 11 varies or respective piezo-electric substrates have different propagating velocities, a demodulated signal strongly correlated with the original base-band signal can be derived from the output terminal 15. Moreover, even if the propagating velocity of the surface acoustic wave locally fluctuates within the piezo-electrical substrate 11, the fluctuation is averaged, and it is also possible to obtain the demodulated signal strongly correlated with the base-band signal.

Figure 3:
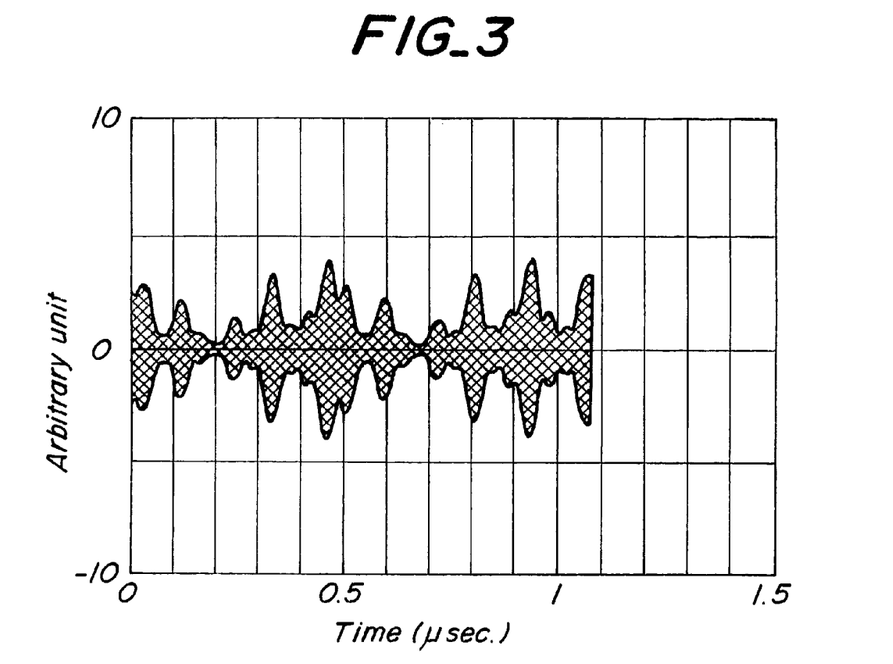
FIG. 3 is a graph representing a demodulate signal obtained in a known surface acoustic wave matched filter when the propagating velocity of the surface acoustic wave changes.

FIG. 3 shows a condition in which the demodulated signal is disturbed by the variation in the propagating velocity of the surface acoustic wave due to the temperature variation of the conventional surface acoustic wave matched filter. The data is obtained under such a condition that the input side electrode has 64 pairs of electrode fingers and the output side electrode has six pairs of electrode fingers. The period $\lambda$ of the electrode fingers of the output side electrode is set to 2.4 μm and the tap distance L is set to 108 $\lambda$. Therefore, an optimum correlation can be attained for the propagating velocity of the surface acoustic wave 6000 m/sec. The graph shows a condition in which the propagating velocity changes to 6000±5 m/sec. The correlation is disturbed largely and the original base-band signal could no more be reproduced reliably.

Figure 4:
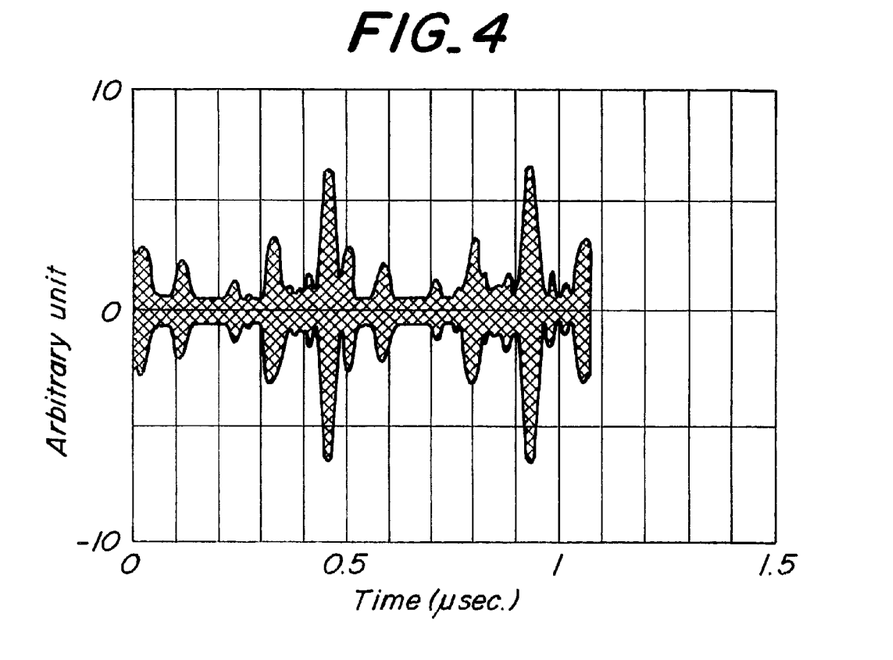
FIG. 4 is a graph showing a demodulate signal obtained in the surface acoustic wave matched filter according to the invention when the propagating velocity of the surface acoustic wave changes.

FIG. 4 shows the demodulated signal obtained by the surface acoustic wave matched filter according to this invention shown in FIG. 2 under the same condition as that stated above. The demodulated signal is obtained in the form of a superimposition of a strongly correlated demodulated signal on the demodulated signal having the correlation strongly disturbed as shown in FIG. 3, but an ideal demodulated signal can be easily derived by an appropriate signal process utilizing a large difference in peak level.

Figure 5:
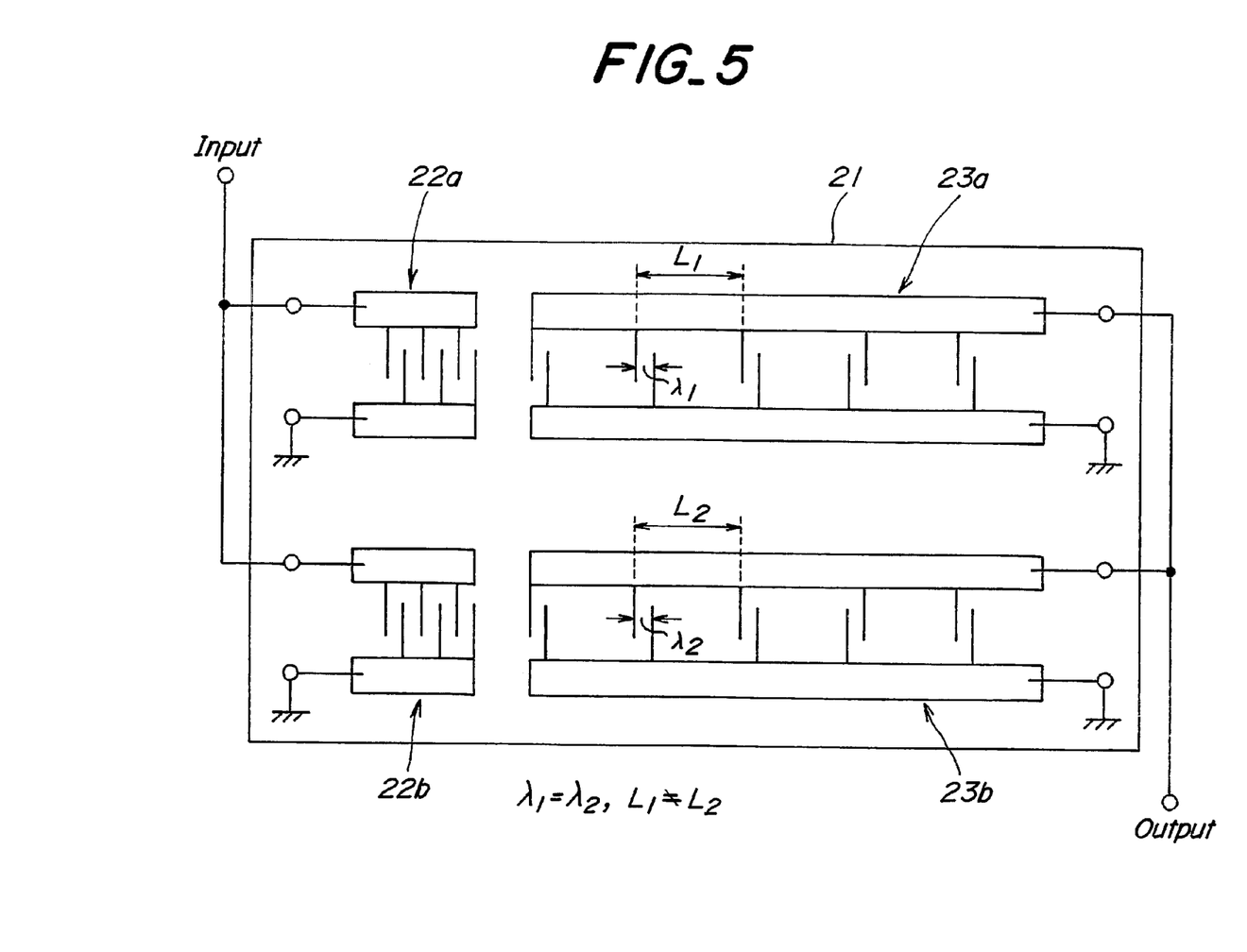
FIG. 5 is a schematic view showing the structure of a second embodiment of the surface acoustic wave matched filter according to this invention.

FIG. 5 shows a second embodiment of the surface acoustic wave matched filter according to the invention. In this embodiment, the filter has two input side electrodes 22a and 22b and two output side electrodes 23a and 23b which are formed on a surface of a piezo-electrical substrate 21 and are arranged in parallel with each other viewed in the propagating direction of the surface acoustic wave, but the period $\lambda_1$ of the electrode fingers of the first output side electrode 23a is equal to the period $\lambda_2$ of the electrode fingers of the second output side electrode 23b, and the distance $L_1$ between taps of the first output side electrodes 23a is different from the distance $L_2$ of the second output side electrode 23b ($\lambda_1 = \lambda_2, L_1 \neq L_2$). Compared with the first embodiment, the electrode pattern of the present embodiment has an advantage that a mask for photolithography can be easily made. Also in the present embodiment, even if the propagating velocity of the surface acoustic wave varies due to temperature variation or fluctuates for respective substrates or within a single substrate, the demodulated signal having the large component strongly correlated with the original base-band signal can be obtained.

In the above the first and the second embodiments, there are provided two output side electrodes, but three or more than three parallel output side electrodes may be provided. Moreover, in the above embodiments, the demodulated signal is obtained by summing the output signals derived from the two output side electrodes, but according to the invention, an output signal may be selected from a plurality of output signals derived from a plurality of output side electrodes.

Figure 6:
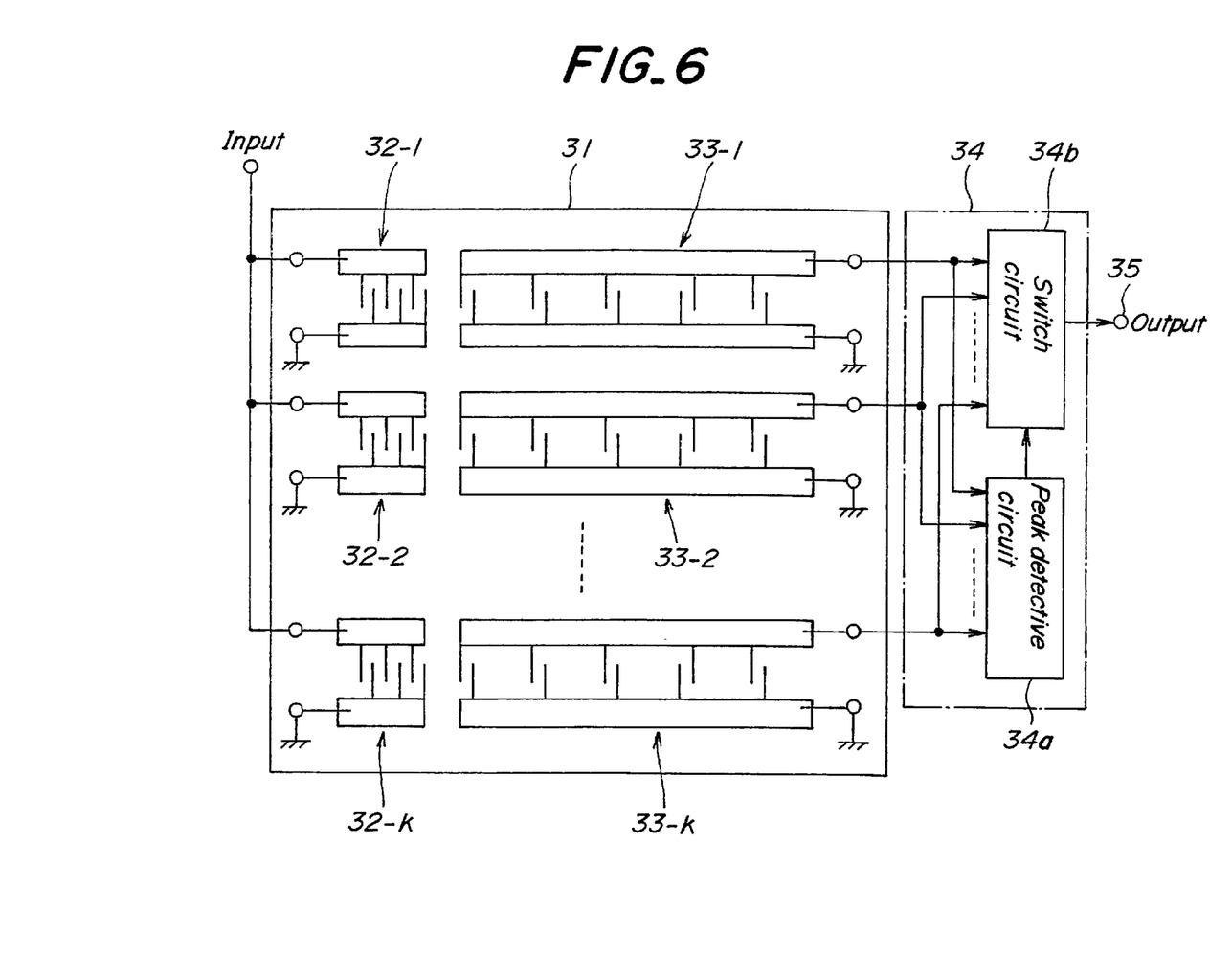
FIG. 6 is a schematic view illustrating the structure of a third embodiment of the surface acoustic wave matched filter according to the present invention.

FIG. 6 shows a third embodiment of the surface acoustic wave matched filter according to the invention, in which an output signal is selected from a plurality of signals derived from a plurality of output side electrodes. In the present embodiment, k input side electrodes 32-1~32-k and k output side electrodes 33-1~33-k are arranged on a piezo-electrical substrate 31 in parallel with each other viewed in the propagating direction of the surface acoustic wave like as the previous embodiments. In the present embodiment, output signals derived from the k output side electrodes 33-1~33-k are supplied to a selection circuit 34 and a single which is most strongly correlated with the original base-band signal is selected, and the thus selected signal is supplied to an output terminal 35 as a demodulated signal. The selection circuit 34 compares a peak detection circuit 34a which compares peaks of the signals derived from the k output side electrodes 33-1~33-k with each other and determines an output side electrode which produces the signal having the highest peak, and a switch circuit 34b which extracts the output signal having the highest peak derived from the detected output side electrode.

In the present invention, the selection of the output signal may be carried out not only by the above explained selection circuit shown in FIG. 6, but the selection of the output signal may be conducted manually. It such a case, the selection circuit may be simply constructed by an analog switch.

Figure 7:
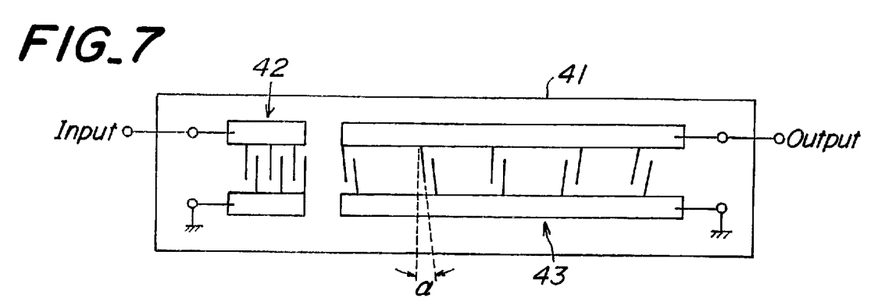
FIG. 7 is a schematic view depicting a fourth embodiment of the surface acoustic wave matched filter according to the invention.

FIG. 7 shows the structure of a fourth embodiment of the surface acoustic wave matched filter according to this invention. In the present embodiment, a single input side electrode 42 and a single output side electrode 43 are provided on a piezo-electrical substrate 41, and electrode fingers of the output side electrode are tilted or inclined an angle α with respect to a direction of the aperture length. The inclination angle α is a minimum value, for example 0°, at a center of the output side electrode 43 and increases gradually toward both ends of the output side electrode in opposite directions. The above structure is equivalent to a structure in which innumerable output side electrodes having continuously varying tap distances are arranged in parallel with each other viewed in the propagating direction of the surface acoustic wave, and the influence of the variation in the propagating velocity of the surface acoustic wave and the fluctuation in the propagating velocity for respective substrates and within a single substrate can be compensated for, and thus the demodulated signal strongly correlated with the original base-band signal can be obtained.

Figure 8:
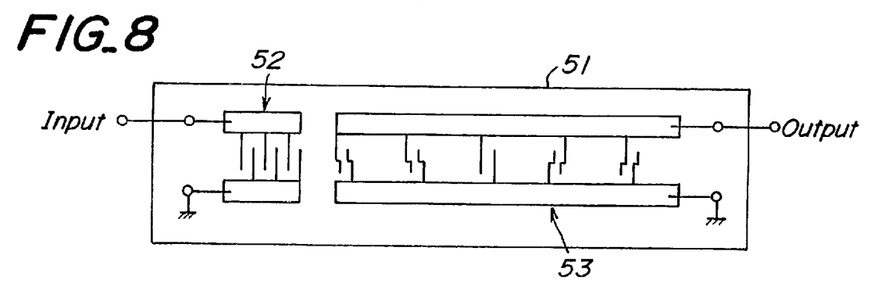
FIG. 8 is a schematic view showing the structure of a fifth embodiment of the surface acoustic wave matched filter according to the invention.

FIG. 8 shows the structure of a fifth embodiment of the surface acoustic wave matched filter according to the invention. In this embodiment, a single input side electrode 52 and a single output side electrode 53 are provided on a piezo-electrical substrate 51, and electrode fingers of the output side electrode are formed like a dog-leg shape viewed in the direction of the aperture length. In this case, at a center of the output side electrode, the electrode fingers are formed to be straight, and steps of the dog-leg shape electrode fingers are gradually increased toward both ends of the output side electrodes in opposite directions. Then, upper and lower halves of the output side electrode 53 have different design values of the propagating velocity. That is to say, the upper half of the output side electrodes 53 is designed to have a strong correlation at a propagating velocity of 6000 m/sec and the lower half is designed to have a strong correlation at a propagating velocity of 6003 m/sec. Then, also in the present embodiment, the influence of the variation in the propagating velocity of the surface acoustic wave and the fluctuation in the propagating velocity for respective substrates and within a single substrate can be compensated for, and thus the demodulated signal strongly correlated with the original base-band signal can be obtained.

Figure 9:
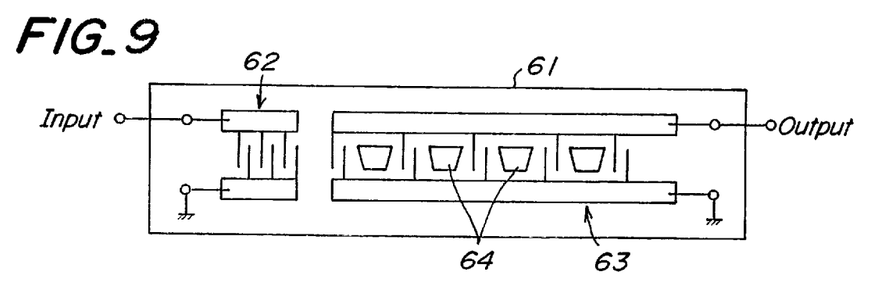
FIG. 9 is a schematic view illustrating the structure of a sixth embodiment of the surface acoustic wave matched filter according to the invention.

FIG. 9 shows the structure of a sixth embodiment of the surface acoustic wave matched filter according to the invention. In this embodiment, a single input side electrode 62 and a single output side electrode 63 are arranged on a piezo-electrical substrate 61, and thin films 64 are provided to cover the surface of the substrate between electrode fingers of the output side electrode such that a covering ratio of a thin film is changed in a direction of the aperture length. As is well known, the propagating velocity of the surface acoustic wave along the surface of the substrate 61 is changed by the thin films 64 formed on the substrate surface, and therefore by changing the covering ratio of the thin films viewed in the direction of the aperture length, it is possible to attain the same operational function as that of the embodiment shown in FIG. 7.

In this embodiment, the covering ratio of the thin films 64 formed between the electrode fingers 63 is changed in the direction of the aperture length, but the thickness of the thin film may be changed in the direction of the aperture length because the propagating velocity of the surface acoustic wave changes also in accordance with a thickness of the thin films. In this case, the covering ratio of the thin films viewed in the aperture length may be not changed.

Figure 10:
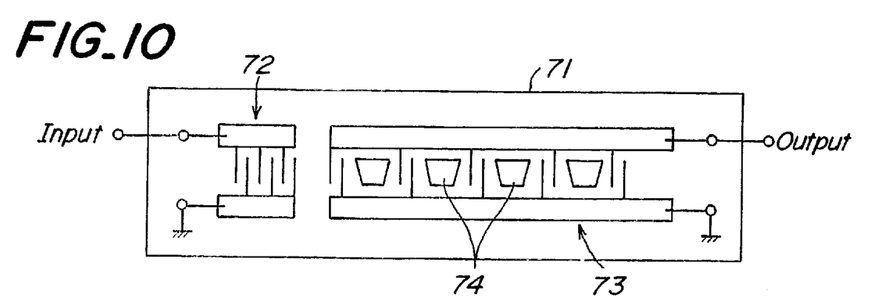
FIG. 10 is a schematic view depicting the structure of a seventh embodiment of the surface acoustic wave matched filter according to the present invention.

FIG. 10 is a schematic view showing the structure of a seventh embodiment of the surface acoustic wave according to the invention. In this embodiment, a single input side electrode 72 and a single output side electrode 73 are provided on a surface of a piezo-electrical substrate 71 and recessed portions 74 are formed in the surface of the substrate between electrode fingers of the output side electrode such that a size of the recessed portion viewed in the propagating direction of the surface acoustic wave is changed in the direction of the aperture length. Since the propagating velocity of the surface acoustic wave is changed by the recessed portions 74 formed in the surface of the piezo-electrical substrate 61, a similar operation function to that of the embodiment illustrated in FIG. 8 can be attained by changing a size of the recessed portions viewed in the direction of the aperture length. In a modification of the present embodiment, a depth of the recessed portions 74 may be changed viewed in the direction of the aperture length.

The present invention is not limited only to the above explained embodiments, but many alternations and modifications may be conceived. For example, in the embodiment of FIG. 6, after combining the signals derived from a plurality of output side electrodes 33-1~33-k, a combined signal may be supplied to a simple limiter circuit to detect a signal having the highest peak. Moreover, in FIGS. 7–10, a plurality of the input side electrodes and output side electrodes may be arranged in parallel with each other in the propagating direction of the surface acoustic wave. In the embodiment of FIG. 8, the dog-leg shaped output side electrode may have plural steps. In the embodiments of FIGS. 9 and 10, the size and thickness of the thin films and the size and depth of the recessed portions may be changed in a stepwise manner instead of continuously.

INDUSTRIAL APPLICABILITY

In the above mentioned surface acoustic wave matched filter according the invention, since the output side electrodes have parts having different delay times between taps, the decrease in the correlation of the demodulated signal with the original base-band signal owing to the variation in the propagating velocity of the surface acoustic wave due to the temperature characteristic and the fluctuation in the propagating velocity for respective substrates or within a single substrate can be avoided. Moreover, the present invention has an advantage that a delay element having the temperature characteristic and a complex circuit of large power consumption are not required.

What is claimed is:

1. A surface acoustic wave matched filter comprising a substrate made of a piezo-electrical material, an input side electrode means formed on the substrate the input side electrode means for receiving a spread spectrum signal and propagating a surface acoustic wave, an output side electrode means formed on the substrate to constitute a delay line with taps for receiving a surface acoustic wave to produce a demodulated signal, wherein said output side electrode means includes parts having identical delay times between adjacent taps and different delay times between non-adjacent taps, the different delay times compensating for variation in propagating delay time due to variations in temperature, substrate crystal quality, or electrode dimensions.

2. A surface acoustic wave matched filter as claimed in claim 1, wherein said input side electrode means includes a plurality of identical input side electrodes located parallel with each other in a propagating direction of a surface acoustic wave, and said output side electrode means includes a plurality of output side electrodes, the taps on one output side electrode are evenly spaced, and have different distances between taps as compared to taps on other output side electrodes, and the output side electrodes are parallel with each other and with said input side electrodes, respectively.

3. A surface acoustic wave matched filter as claimed in claim 1, wherein said input side electrode means includes a plurality of identical input side electrodes parallel with each other in a propagating direction of a surface acoustic wave, and said output side electrode means includes a plurality of output side electrodes having different scales in the propagating direction of the surface acoustic wave the output side electrodes are parallel with each other and with said input side electrodes, respectively.

4. A surface acoustic wave matched filter as claimed in claim 3 or 2, wherein a signal obtained by adding output signals supplied from said plurality of output side electrodes is derived as the demodulated signal.

5. A surface acoustic wave matched filter as claimed in claim 3 or 2, further comprising a selection circuit for selecting one of output signals derived from said plurality of output side electrodes as the demodulated signal.

6. A surface acoustic wave matched filter as claimed in claim 5, wherein said selection circuit includes a peak detection circuit for detecting an output side electrode which derives an output signal having a highest peak, and a switch circuit for selecting an output signal derived from said selected output side electrode as the demodulated signal.

7. A surface acoustic wave matched filter as claimed in claim 1, wherein said output side electrode means includes an output side electrode having electrode fingers which are inclined with respect to a direction of an aperture length.

8. A surface acoustic wave matched filter as claimed in claim 7, wherein an inclination angle of said electrode fingers is 0 degree at a center of the output side electrode and is gradually increased toward both ends of the output side electrode in opposite directions.

9. A surface acoustic wave matched filter as claimed in claim 7, wherein said input side electrode means includes a plurality of parallel input side electrodes having different design standard propagating velocities, and said output side electrode means includes a plurality of parallel output side electrodes having different design standard propagating velocities and arranged correspondingly to said plurality of input side electrodes, respectively.

10. A surface acoustic wave matched filter as claimed in claim 9, wherein a signal obtained by adding output signals supplied from said plurality of output side electrodes is derived as the demodulated signal.

11. A surface acoustic wave matched filter as claimed in claim 9, further comprising a selection circuit for selecting one of output signals derived from said plurality of output side electrodes as the demodulated signal.

12. A surface acoustic wave matched filter as claimed in claim 11, wherein said selection circuit includes a peak detection circuit for detecting an output side electrode which derives an output signal having a highest peak, and a switch circuit for selecting an output signal derived from said selected output side electrode as the demodulated signal.

13. A surface acoustic wave matched filter as claimed in claim 1, wherein said output side electrode means includes an output side electrode which has electrode fingers shaped in a dog-leg viewed in a direction of an aperture length.

14. A surface acoustic wave matched filter as claimed in claim 13, wherein at a center of the output side electrode, said electrode fingers are straight, and on both sides of the center the electrode fingers bend in opposite directions and have a step which is increased toward both ends of the output side electrode.

15. A surface acoustic wave matched filter as claimed in claim 1, wherein said output side electrode means includes an output side electrode which comprises thin films provided on the surface of the substrate between electrode fingers, and a thickness of said thin films is changed in a direction of an aperture length.

16. A surface acoustic wave matched filter as claimed in claim 1, wherein said output side electrode means includes an output side electrode which comprise recessed portions formed in the surface of the substrate between electrode fingers, and a size of said recessed portions viewed in the propagating direction of the surface acoustic wave is changed in a direction of an aperture length.

* * * * *